(12) United States Patent
Harada (10) Patent No.: US 6,756,813 B2
(45) Date of Patent: Jun. 29, 2004

(54) VOLTAGE TRANSLATOR

(75) Inventor: Teruhiro Harada, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/173,616

(22) Filed: Jun. 19, 2002

(65) Prior Publication Data

US 2003/0094971 A1 May 22, 2003

(30) Foreign Application Priority Data

Nov. 21, 2001  (JP) ....................................... 2001-356113

(51) Int. Cl.[7] ............................................ H03K 19/175
(52) U.S. Cl. ........................ 326/81; 326/121; 327/333
(58) Field of Search ...................... 326/80–83, 86–87, 326/112, 119–122; 327/333, 437

(56) References Cited

U.S. PATENT DOCUMENTS 4,321,491 A * 3/1982 Atherton et al. .............. 326/68
5,650,742 A * 7/1997 Hirano ........................ 327/333
6,066,975 A * 5/2000 Matano ....................... 327/333
6,154,084 A * 11/2000 Winnerl ...................... 327/333

FOREIGN PATENT DOCUMENTS

JP    59214325 A * 12/1984    .......... H03K/19/00
JP    10149693 A    6/1998

OTHER PUBLICATIONS

Rhyne, Fundamental of Digital Systems Design, N.J., 1973, pp. 70–71*

* cited by examiner

Primary Examiner—James H. Cho
(74) Attorney, Agent, or Firm—Volentine Francos, PLLC (57) ABSTRACT

The voltage translator uses a PMOS transistor connected to a positive voltage source and a wordline, an NMOS transistor connected to a voltage source lower than the earth potential and a wordline as output stages, and has a PMOS transistor having a feedback function which is connected to the positive voltage source and an NMOS transistor having a feedback function which is connected to a voltage source lower than the earth potential. In the voltage translator, not only the positive voltage but a voltage lower than the earth potential as well is supplied to a selected wordline.

13 Claims, 4 Drawing Sheets

VOLTAGE TRANSLATOR

BACKGROUND OF THE INVENTION

1. Field of the Invention

The present invention relates to a voltage translator to be used for a semiconductor integrated circuit, and more particularly to a voltage translator for wordline driving of a flash EEPROM.

2. Description of Related Art

In a semiconductor integrated circuit, a plurality of voltages may be used internally. Particularly in a flash EEPROM, different voltages are required depending on the mode of memory operation in addition to the normal logical control voltage Vdd and earth potential. Typically the voltage to be applied to a wordline is about 5V for a read operation, about 12V for a write operation, and about −9V for an erase operation. These operating voltages are not absolute values but are values to be changed as semiconductor manufacturing processing advances.

Figure 4:
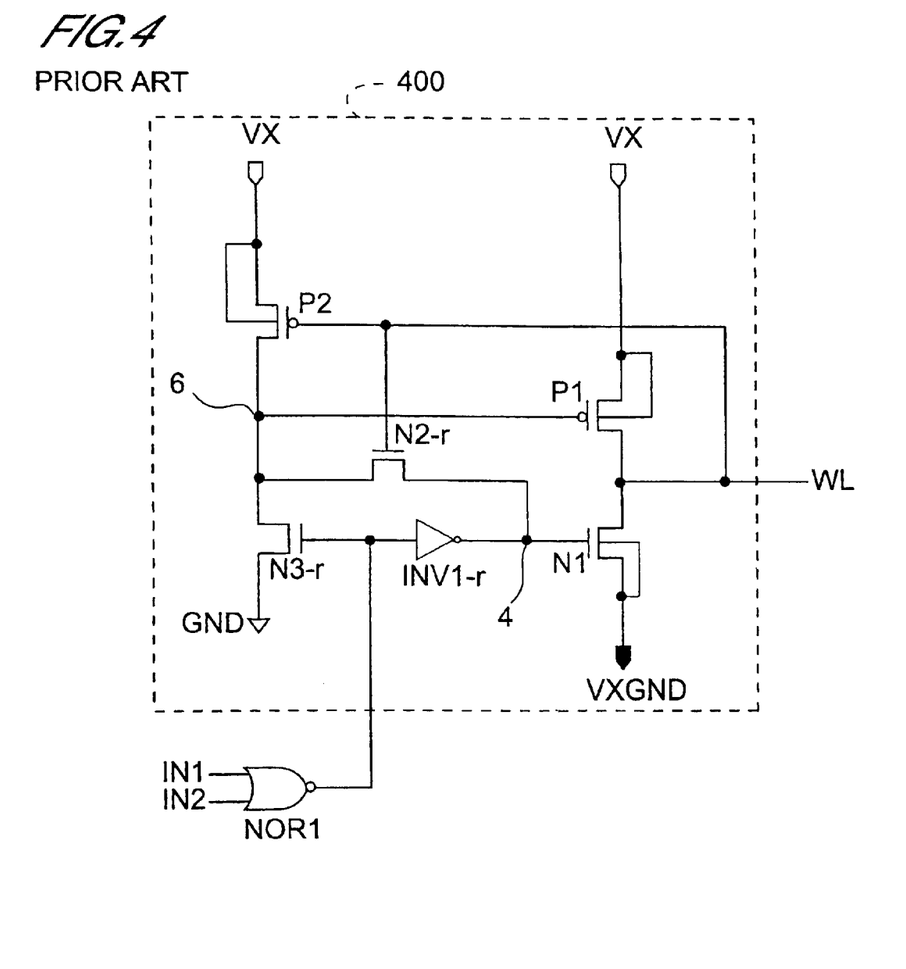
FIG. 4 is a circuit diagram depicting a configuration of a conventional voltage translator.

A circuit having a function to supply voltage other than the logical control voltage Vdd and earth potential to a wordline is called a "voltage translator". A circuit disclosed in Japanese Unexamined Patent Publication No. H10-149693 is an example thereof. FIG. 4 shows an outline of the circuit of the voltage translator stated in the above mentioned publication. This voltage translator 400 has a configuration where the wordline WL is connected to about a 5.5V operating voltage source VX via a first PMOS switch transistor P1 on the one hand, and is connected to the voltage source VXGND, which is the earth potential, via the first NMOS switch transistor N1.

This voltage translator 400 is further comprised of a second PMOS feedback transistor P2 which is directly driven depending on the voltage level of the wordline WL, and a second NMOS feedback transistor N2-r which is directly driven depending on the voltage level of the wordline WL. The voltage translator 400 also includes an inverter INV1-r which inverts and outputs signals from the decoder shown as the NOR circuit NOR1, and the output terminal of the inverter INV1-r is connected to the control electrode of the first NMOS switch transistor N1. According to the above mentioned publication, in this configuration, the. 5.5V operating potential VX of the wordline and the 0V earth potential are switched at high-speed using the ON and OFF of the second NMOS feedback transistor N2-r.

However, the operating voltage of the flash EEPROM could be a value other than 5.5V and 0V depending on the operation mode. In the conventional voltage translator 400 shown in FIG. 4, it is possible to select one wordline from the many wordlines (not illustrated) of the voltage translator connected to the voltage source VXGND so as to execute a read operation and a write operation.

However, an erase operation cannot be executed with one selected wordline. This is because when a −9V voltage is applied to the voltage source VXGND, the first NMOS switch transistor turns ON since a voltage more than the threshold voltage of the first NMOS switch transistor is applied between the first main electrode and the control electrode of the first NMOS switch transistor, even if the control electrode is 0V ("L" level). As a result, the voltage of all the wordlines connected to the voltage source VXGND become −9V. Therefore the voltage translator 400 can be applied only to a batch erasing type flash EEPROM.

If voltage in the "L" level is input to both input terminals IN1 and IN2 of the decoder NOR1 when the potential of the wordline is −9V, the control potential of the connection point 6, that is, the first PMOS switch transistor P1, becomes 0V, where this transistor is in ON status.

In other words, both the first PMOS switch transistor P1 and the first NMOS switch transistor N1 become ON status, where a through current flows continuously from the voltage source VX to the voltage source VXGND.

As a consequence, a voltage translator which can supply voltage less than the earth potential, only to a selected wordline, has been desired.

SUMMARY OF THE INVENTION

It is an object of the present invention to provide a voltage translator which can supply a positive operating voltage to a selected wordline, and also which can supply an operating voltage less than the earth potential, which is different from the above operating voltage, depending on the decoder signal.

It is another object of the present invention to provide a voltage translator where the speed of switching the wordline voltage to the earth voltage is increased by disposing an NMOS transistor having a feedback function in the circuit configuration.

It is still another purpose of the present invention to provide a voltage translator which switching speed is faster.

It is still another purpose of the present invention to provide a voltage translator where the configuration can be compact with a small number of transistors.

For this, the voltage translator of the present invention is connected to the first operating voltage source and the second operating voltage source. The voltage translator supplies a positive first operating voltage from the first operating voltage source, or supplies a second operating voltage lower than the earth potential from the second operating voltage source to a wordline depending on the output signal of the decoder, and has the following features. In other words, the voltage translator of this invention is comprised of the first and second NMOS transistors and the first and second PMOS transistors.

The first PMOS transistor has a first main electrode connected to the first operating voltage source, and a second main electrode connected to the wordline.

The first NMOS transistor has a first main electrode connected to the second operating voltage source, and a second main electrode connected to the wordline.

The second PMOS transistor has a first main electrode connected to the first operating voltage source, a second main electrode connected to a control electrode of the first PMOS transistor, and a control electrode connected to the wordline.

The second NMOS transistor has a first main electrode connected to the second operating voltage source, a second main electrode connected to a control electrode of the first NMOS transistor, and a control electrode connected to the wordline.

The second PMOS transistor functions as a feedback transistor in the voltage translator, and controls the first PMOS transistor P1. The second NMOS transistor also functions as a feedback transistor in the voltage translator, and controls the first NMOS transistor N2.

According to such a configuration, a positive first operation voltage can be supplied, and a second operating voltage less than the earth potential can be supplied to a selected wordline, depending on the output signal of the decoder.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Embodiments of the present invention will now be described with reference to the accompanying drawings. The descriptions below concern only the preferred embodiments and the numerical conditions presented below are merely examples.

In each drawing, the same number and the same symbol are used for the same composing element.

In each embodiment, the first main electrode of an MOS transistor is described as a source electrode, the second main electrode as the drain electrode, and the control electrode as the gate electrode.

The logical control voltage Vdd is 3.3V, the first operating voltage VX is a voltage in the range of the logical control voltage Vdd to 12V, and the second operating voltage VXGND is an appropriate voltage between −9V and 0V (including the earth potential, that is, 0V).

First Embodiment

Configuration

Figure 1:
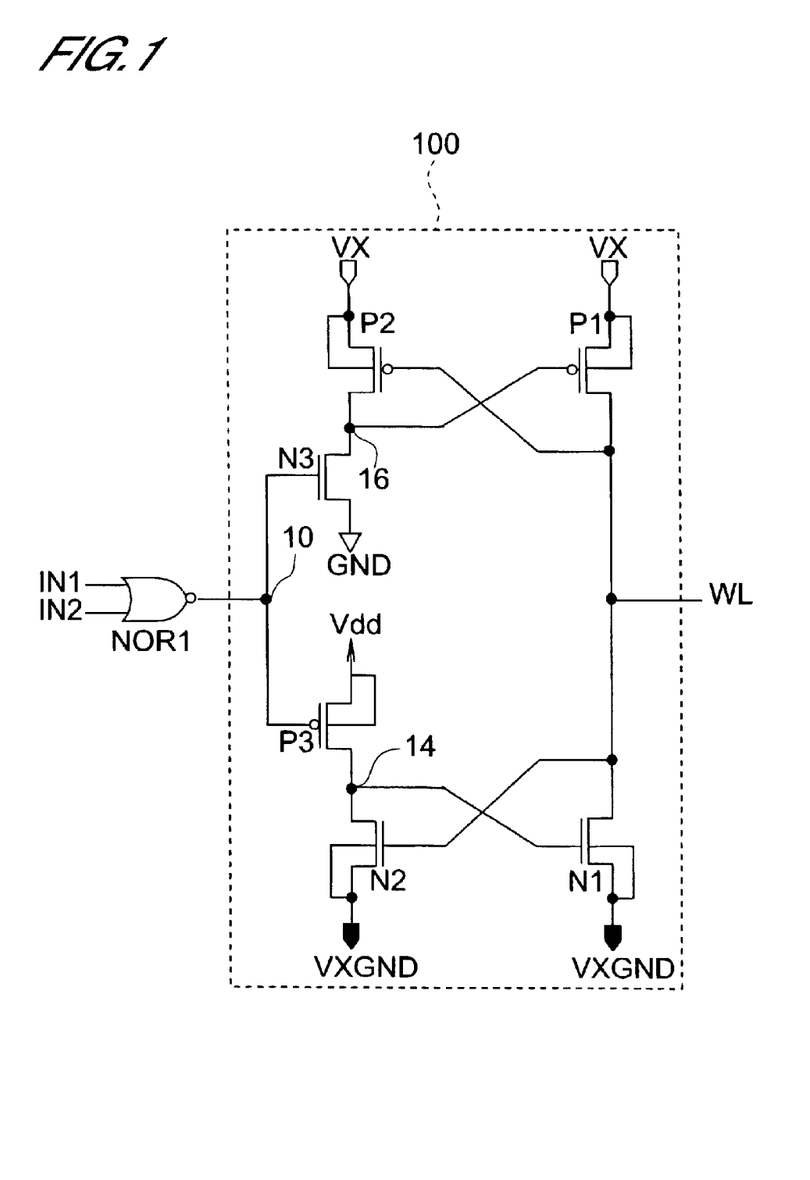
FIG. 1 is a circuit diagram depicting a configuration example of a first embodiment of the voltage translator of the present invention.

FIG. 1 is a circuit diagram depicting a preferred configuration example of the voltage translator of the first embodiment of the present invention. The voltage translator 100 is connected to the first operating voltage source VX and the second operating voltage source VXGND, and supplies either the first or second operating voltages to the wordline WL.

In the first PMOS transistor (hereafter called the first P-type transistor) P1, the source electrode is connected to the first operating voltage source VX, and the drain electrode is connected to the wordline WL.

In the first NMOS transistor (hereafter called the first N-type transistor) N1, the source electrode is connected to the second operating voltage source VXGND, and the drain electrode is connected to the wordline WL.

In the second PMOS transistor (hereafter called the second P-type transistor) P2, the source electrode is connected to the first operating voltage source VX, the drain electrode is connected to the gate electrode of the first P-type transistor P1, and the gate electrode is connected to the wordline WL.

In the second NMOS transistor (hereafter called the second N-type transistor) N2, the source electrode is connected to the second operating voltage source VXGND, the drain electrode is connected to the gate electrode of the first N-type transistor N1, and the gate electrode is connected to the wordline WL.

In the third NMOS transistor (hereafter called the third N-type transistor) N3, the source electrode is grounded (that is, connected to GND), the drain electrode is connected to the gate electrode of the first P-type transistor P1 and the drain electrode of the second P-type transistor (see the connection point 16), and the gate electrode is connected to the output terminal of the decoder NOR1 (see the connection point 10). The connection point 10 is a connection point between the output terminal of the decoder NOR1 and each control electrode of the third N-type and third P-type transistors N3 and P3. The connection point 16 is a connection point of the control electrode of the first P-type transistor P1, the drain electrode of the second P-type transistor P2, and the drain electrode of the third N-type transistor N3.

In the third PMOS transistor (hereafter called the third P-type transistor) P3, the source electrode is connected to the logical control voltage source Vdd, the drain electrode is connected to the gate electrode of the first N-type transistor N1 and the drain electrode of the second N-type transistor N2 (see the connection point 14), and the gate electrode is connected to the output terminal of the decoder NOR1 (see the connection point 10). The connection point 14 is a connection point of the control electrode of the first N-type transistor N1, the drain electrode of the second N-type transistor N2, and the drain electrode of the third P-type transistor P3.

Operation

As described above, according to the voltage translator 100 of this embodiment, either the first operating voltage VX or the second operating voltage VXGND is supplied to the wordline WL.

1-1: Transition Operation to the First Operating Voltage VX

Assume that the voltage of the wordline WL in the initial state is the earth potential. In order to start the transition operation, the "L" level voltage signal is input to both the input terminals IN1 and IN2 of the decoder NOR1. Then the voltage of the connection point 10 becomes "H" level. By this "H" level, the third P-type transistor P3 becomes OFF state where this transistor is not conducted, and the third N-type transistor N3 becomes ON state.

Since the third N-type transistor N3 becomes ON state, the voltage of the connection point 16 is pulled down to the earth potential. As a result, the first P-type transistor P1 becomes ON state and the voltage of the wordline WL rises.

The third P-type transistor P3, on the other hand, is in OFF state. By the rise of the voltage of the wordline WL, the second N-type transistor N2 becomes ON state, and as a result, the voltage of the connection point 14 drops, and the first N-type transistor N1 becomes OFF state. The second P-type transistor becomes OFF state during the rising process of the voltage of the wordline WL.

After these processes, the wordline WL becomes the first operating voltage VX. The first operating voltage VX is variable in the range of the logical control voltage Vdd to 12V, therefore the voltage value can be the Vdd potential when the transition operation starts, and 12V when the transition operation ends.

In this state, the first N-type, the second P-type and the third P-type transistors are in OFF state, and the first P-type, the second N-type and the third N-type transistors are in ON state.

Therefore the through current between the first operating voltage source VX and the second operating voltage source VXGND, the through current between the first operating voltage source VX and the ground GND, and the through current between the logical control voltage source Vdd and the second operating voltage source VXGND do not exist.

1-2: Transition Operation to the Second Operating Voltage VXGND

Assume that the voltage of the wordline WL in the initial state is the earth potential. In order to start the transition operation, the "H" level voltage signal is input to either one or both of the input terminals IN1 and IN2 of the decoder NOR1. Then the voltage of the connection point 10 becomes "L" level. By this "L" level, the third p-type transistor P3 becomes ON state, and the third N-type transistor N3 becomes OFF state.

Since the third P-type transistor P3 becomes ON state, the voltage of the connection point 14 rises to "H" level. During this rise, the first N-type transistor N1 becomes ON state, and the voltage of the wordline WL drops.

The third N-type transistor N3, on the other hand, is in OFF state. By the drop of the voltage of the wordline WL, the second P-type transistor P2 becomes ON state, and as a result, the voltage of the connection point 16 rises to the first operating potential VX. As a result, the first P-type transistor P1 becomes OFF state.

After these processes, the wordline WL becomes the second operating voltage VXGND. The second operating voltage VXGND is variable in the range of the earth potential to −9V, therefore the voltage value can be the earth potential when the transition operation starts, and −9V when the transition operation ends.

In this state, the first N-type, the second P-type and the third P-type transistors are in ON state, and the first P-type, the second N-type and the third N-type transistors are in OFF state.

Therefore the through current between the first operating voltage source VX and the second operating voltage source VXGND, the through current between the first operating voltage source VX and the ground GND, and the through current between the logical control voltage source Vdd and the second operating voltage source VXGND do not exist.

As described above, the voltage translator of this embodiment can turn the first N-type transistor N1 ON and OFF depending on the decoder signal. Therefore not only the first operating voltage VX but the second operating voltage VXGND as well can be supplied to a selected wordline WL.

Also by disposing the second N-type transistor N2 which has a feedback function, the transition speed from the wordline voltage to the second operating voltage VXGND is fast.

The conventional voltage translator 400 has the inverter INV1-r internally, so it takes time to invert the decoder signal. Therefore this internal inverter is a factor which interferes with fast switching in the conventional voltage translator 400. In the case of the configuration example of the first embodiment of the present invention, on the other hand, the inverter is not built-in, so fast switching is possible compared with the conventional voltage translator 400.

Second Embodiment

Configuration

Figure 2:
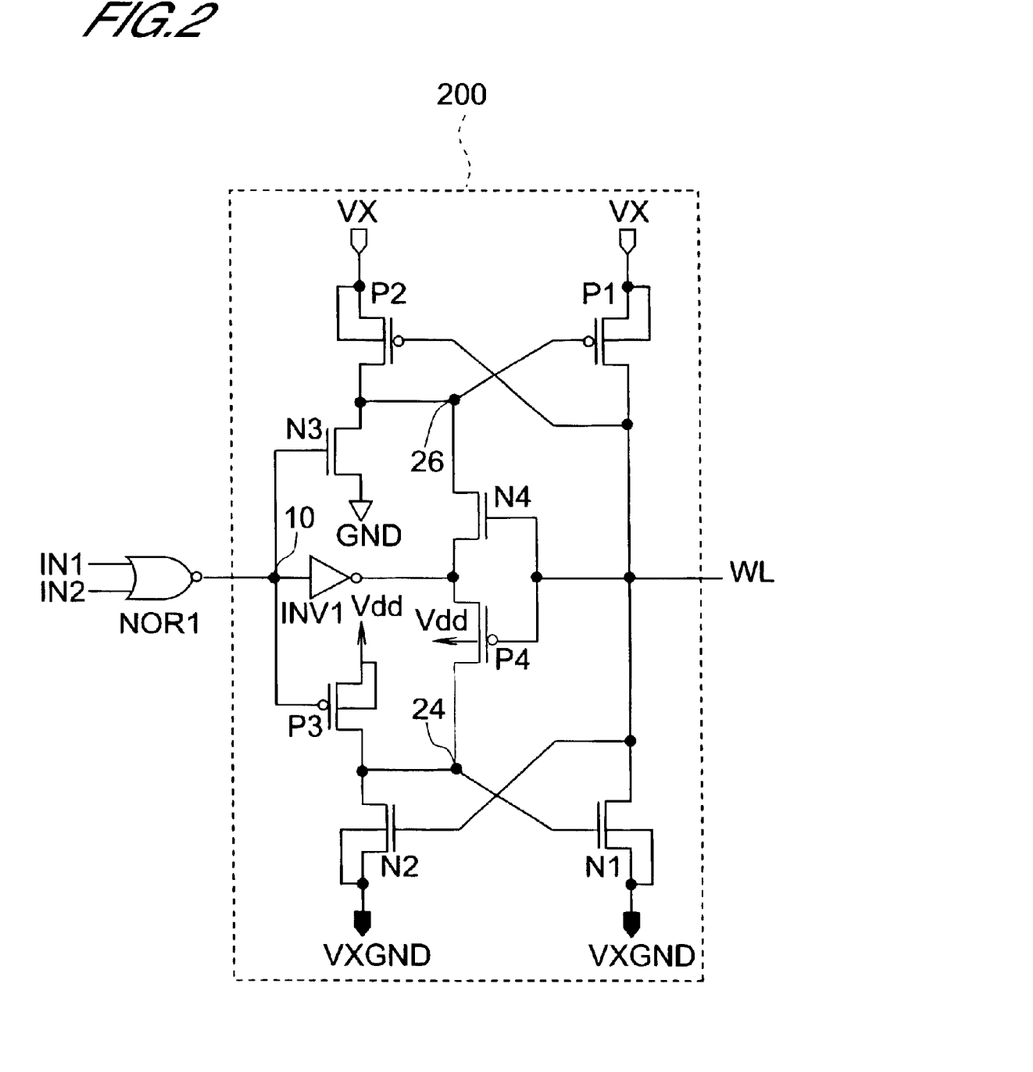
FIG. 2 is a circuit diagram depicting a configuration example of a second embodiment of the voltage translator of the present invention.

FIG. 2 is a circuit diagram depicting a preferred configuration example of the voltage translator of the second embodiment of the present invention. The voltage translator 200 of the second embodiment includes the inverter INV1, the fourth NMOS transistor (hereafter called the fourth N-type transistor) N4, and the fourth PMOS transistor (hereafter called the fourth P-type transistor) P4, in addition to the circuit configuration of the voltage translator of the first embodiment.

The input terminal of the inverter INV1 is connected to the output terminal of the decoder NOR1 (see the connection point 10).

In the fourth N-type transistor N4, the source electrode is connected to the drain electrode of the second P-type transistor P2 and the gate electrode of the first P-type transistor (see the connection point 26), the drain electrode is connected to the output terminal of the inverter INV1, and the gate electrode is connected to the wordline WL. The connection point 26 is a point where the source electrode of the fourth N-type transistor N4 is connected to the above mentioned connection point 16.

In the fourth P-type transistor P4, the source electrode is connected to the drain electrode of the second N-type transistor N2 and the gate electrode of the first N-type transistor N1 (see the connection point 24), the drain electrode is connected to the output terminal of the inverter INV1, and the gate electrode is connected to the wordline WL. The connection point 24 is a point where the source electrode of the fourth P-type transistor P4 is connected to the above mentioned connection point 14.

Operation

As described above, according to the voltage translator 200 of this embodiment, either the first operating voltage VX or the second operating voltage VXGND is supplied to the wordline WL.

2-1: Transition Operation to the First Operating Voltage VX

Assume that the voltage of the wordline WL in the initial state is the earth voltage. In order to start the transition operation, the "L" level voltage signal is input to both the input terminals IN1 and IN2 of the decoder NOR1. Then the voltage of the connection point 10 becomes "H" level. By this "H" level, the third P-type transistor P3 becomes OFF state, and the third N-type transistor N3 becomes ON state.

Since the third N-type transistor N3 becomes ON state, the voltage of the connection point 26 is pulled down to the earth potential. As a result, the first P-type transistor P1 becomes ON state, and the voltage of the wordline WL rises.

When the voltage of the wordline WL exceeds the threshold voltage of the fourth N-type transistor N4, the fourth N-type transistor N4 becomes ON state. By this, the connection point 26 conducts with the output terminal of the inverter INV1 and the voltage of the connection point 26 quickly drops to the earth potential. The first P-type transistor P1 increases the strength of the ON state.

The third P-type transistor P3, on the other hand, is in OFF state, so when the voltage of the wordline WL rises, the second N-type transistor N2 becomes ON state, and the voltage of the connection point 24 becomes second operating voltage VXGND.

The fourth P-type transistor P4 is in ON state in the initial state (when the wordline WL is at earth potential), and assists the drop in voltage of the connection point 24, but changes to OFF state as the voltage of the wordline WL rises. Since the voltage of the connection point 24 is at the second operating voltage VXGND, the voltage of the source electrode and that of the gate electrode of the first N-type transistor N1 are the same. Therefore the first N-type transistor N1 is in OFF state. The second P-type transistor P2 becomes OFF state in the process of the voltage of the wordline WL rising to the first operating voltage VX.

After these processes, the wordline WL becomes the first operating voltage VX. The first operating voltage VX is variable in the range of the logical control voltage Vdd to 12V, and therefore the voltage value can be Vdd when the transition operation starts, and 12V when the transition operation ends.

In this state, the first N-type, the second P-type, the third P-type, and the fourth P-type transistors are in OFF state, and the first P-type, the second N-type, the third N-type, and the fourth N-type transistors are in ON state.

Therefore the through current does not exist in the circuit of the voltage translator 200.

2-2: Transition Operation to the Second Operating Voltage VXGND

Assume that the voltage of the wordline WL in the initial state is the earth potential. In order to start the transition operation, the "H" level voltage signal is input to either one or both of the input terminals IN1 and IN2 of the decoder NOR1. Then the voltage of the connection point 10 becomes "L" level. By this "L" level, the third P-type transistor P3 becomes ON state, and the third N-type transistor N3 becomes OFF state.

Since the third P-type transistor P3 becomes ON state, the voltage of the connection point 24 rises to the "H" level. During this rise, the first N-type transistor N1 becomes ON state, and the voltage of the wordline WL drops.

When the threshold voltage of the fourth P-type transistor P4 is Vtp4, the fourth P-type transistor P4 turns ON, and the voltage of the connection point 24 rises to the logical control potential Vdd if the voltage of the wordline WL drops lower than Vdd−|Vtp4|. The first N-type transistor N1 increases the strength of the ON state.

The third N-type transistor N3, on the other hand, is in OFF state, so when the voltage of the wordline WL drops, the second P-type transistor P2 becomes ON state, and the voltage of the connection point 26 rises to the first operating voltage VX. As a result, the first P-type transistor P1 becomes OFF state.

The fourth N-type transistor N4 remains in the OFF state at the initial state, and the second N-type transistor N2 becomes OFF state during the process of the wordline WL becoming the second operating voltage VXGND.

After these processes, the wordline WL becomes the second operating voltage VXGND. The second operating voltage VXGND is variable in the range of the earth potential to −9V. Therefore the voltage value can be earth potential when the transition operation starts, and −9V when the transition operation ends.

In this state, the first N-type, the second P-type, the third P-type, and the fourth P-type transistors are in ON state, and the first P-type, the second N-type, the third N-type and the fourth N-type transistors are in OFF state.

Therefore the through current does not exist in the circuit of the voltage translator 200.

As described above, the voltage translator of this embodiment can turn the first N-type transistor N1 ON and OFF depending on the decoder signal. Therefore not only the first operating voltage VX but the second operating voltage VXGND as well can be supplied to a selected wordline WL.

Also by disposing the second N-type transistor N2 having a feedback function, the transition speed from the wordline voltage to the second operating voltage VXGND is fast.

Also by disposing the fourth N-type transistor N4 for accelerating the "ON" of the first P-type transistor P1, and the fourth P-type transistor P4 for accelerating the "ON" of the first N-type transistor N1, switching faster than the conventional voltage translator 400 is possible.

Third Embodiment

Configuration

Figure 3:
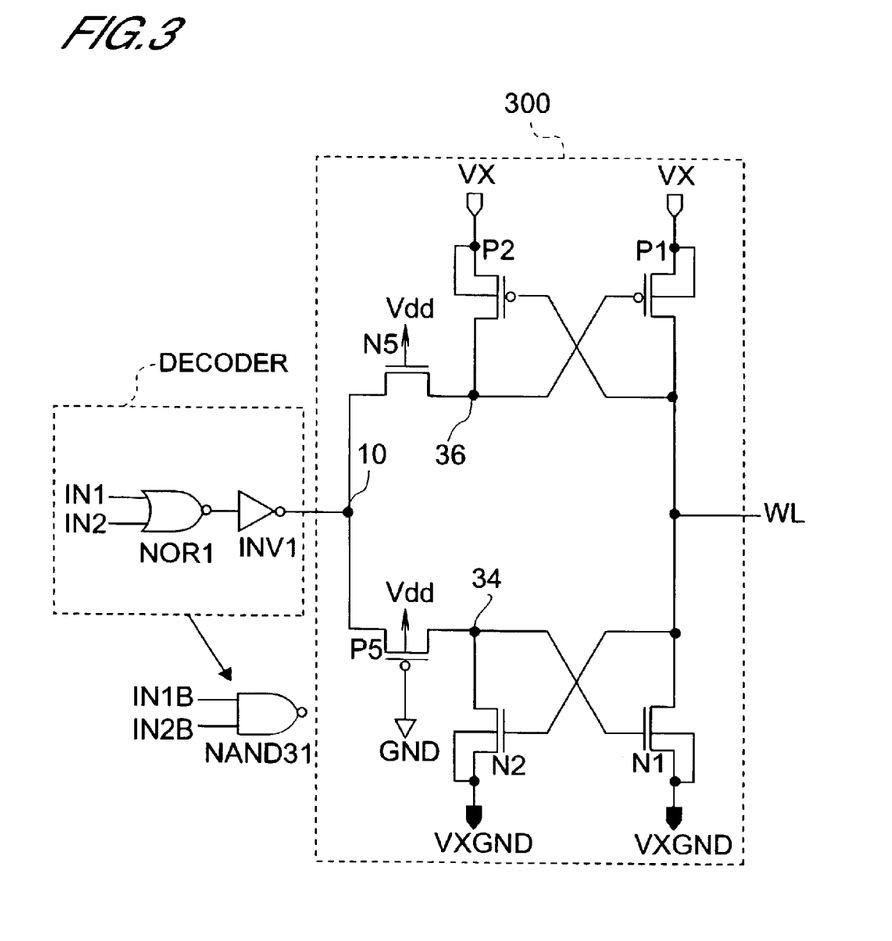
FIG. 3 is a circuit diagram depicting a configuration example of a third embodiment of the voltage translator of the present invention.

FIG. 3 is a circuit diagram depicting a preferred configuration example of the voltage translator of the third embodiment of the present invention. The voltage translator 300 is connected to the first operating voltage source VX and the second operating voltage source VXGND, and supplies one of the voltages to the wordline WL.

In the first P-type transistor P1, the source electrode is connected to the first operating voltage source VX, and the drain electrode is connected to the wordline WL.

In the first N-type transistor N1, the source electrode is connected to the second operating voltage source VXGND, and the drain electrode is connected to the wordline WL.

In the second P-type transistor P2, the source electrode is connected to the first operating voltage source VX, the drain electrode is connected to the gate electrode of the first P-type transistor P1, and the gate electrode is connected to the wordline WL.

In the second N-type transistor N2, the source electrode is connected to the second operating voltage source VXGND, the drain electrode is connected to the gate electrode of the first N-type transistor N1, and the gate electrode is connected to the wordline WL.

In the fifth NMOS transistor (hereafter the fifth N-type transistor) N5, the gate electrode is connected to the logical control voltage source Vdd, one of the remaining two electrodes is connected to the output of the decoder, that is, the connection point 10, and the other electrode is connected to the gate electrode of the first P-type transistor P1 and the drain electrode of the second P-type transistor P2 (see the connection point 36).

In the fifth PMOS transistor (hereafter the fifth P-type transistor) P5, the gate electrode is connected to the earth potential GND, one of the remaining two electrodes is connected to the output of the decoder, that is, the connection point 10, and the other electrode is connected to the gate electrode of the first N-type transistor N1 and the drain electrode of the second N-type transistor N2 (see the connection point 34).

The decoder is comprised of NOR1, which has an input terminal to input the signals IN1 and IN2, and the inverter INV1, but the NAND circuit NAND 31, indicated by the arrow mark from the decoder in FIG. 3, can be substituted. This NAND circuit NAND 31 has an input terminal to input the inverted phase signal IN1B of the signal IN1 and the inverted phase signal IN2B of the signal IN2.

Operation

As described above, according to the voltage translator 300 of this embodiment, either the first operating voltage VX or the second operating voltage VXGND is supplied to the wordline WL.

3-1: Transition Operation to the First Operating Voltage VX

Assume that the voltage of the wordline WL in the initial state is the earth potential. In order to start the transition operation, the "L" level voltage signal is input to both the input terminals IN1 and IN2 of the decoder NOR1. Then the voltage of the connection point 10 becomes "L" level.

Since the fifth N-type transistor N5 is in ON state, the voltage of the connection point 36 becomes "L" level, and the first P-type transistor P1 is in ON state.

Assume that the threshold voltage of the fifth P-type transistor P5 is Vtp5. Since the fifth P-type transistor P5 is in ON state, the connection point 34 is influenced by the potential of the connection point 10, and becomes a voltage of |Vtp5|. Therefore the voltage of |Vtp5| is applied to the gate electrode of the first N-type transistor N1, which becomes a weak ON state.

As a result of this operation, the wordline WL rises to the first operating voltage VX. Assume that the threshold voltage of the second N-type transistor N2 is Vtn2. If the voltage of the wordline WL becomes higher than the voltage (VXGND+Vtn2), the second N-type transistor N2 becomes ON state, and the voltage of the connection point 34 drops to the second operating voltage VXGND. And the first N-type transistor N1 becomes OFF state. During the process of the wordline WL becoming the first operating voltage VX, the second P-type transistor P2 becomes OFF state.

After these processes, the wordline WL becomes the first operating voltage VX. The first operating voltage VX is variable in the range of the logical control voltage Vdd to 12V, therefore the voltage value can be Vdd when the transition operation starts, and 12V when the transition operation ends.

In this state, the first N-type and the second P-type transistors are in OFF state, and the first P-type and the second N-type transistors are in ON state.

Therefore through current does not exist in the circuit of the voltage translator 300.

3-2: Transition Operation to the Second Operating Voltage VXGND

Assume that the voltage of the wordline WL in the initial state is the earth potential. In order to start the transition operation, the "H" level voltage signal is input to either one or both of the input terminals IN1 and IN2 of the decoder NOR1. Then the voltage of the connection point 10 becomes "H" level.

Since the fifth P-type transistor P5 is in ON state, the voltage of the connection point 34 becomes "H" level, and the first N-type transistor N1 is in ON state.

Assume that the threshold voltage of the fifth N-type transistor N5 is Vtn5. Since the fifth N-type transistor N5 is in ON state, the voltage of the connection point 36 is influenced by the voltage of the connection point 10, and becomes voltage (Vdd−Vtn5). Therefore the voltage (Vdd−Vtn5) is applied to the gate electrode of the first P-type transistor P1, which becomes a weak ON state.

As a result of this operation, the wordline WL drops to the second operating voltage VXGND. Assume that the threshold voltage of the second P-type transistor P2 is Vtp2. If the voltage of the wordline WL becomes lower than the voltage (VXGND+Vtp2), the second P-type transistor P2 becomes ON state, and the voltage of the connection point 36 rises to the first operating voltage VX. And the first P-type transistor P1 becomes OFF state. During the process of the wordline WL becoming the second operating voltage VXGND, the second N-type transistor N2 becomes OFF state.

After these processes, the wordline WL becomes the second operating voltage VXGND. The second operating voltage VXGND is variable in the range of the earth potential to −9V, therefore the voltage value can be the earth potential when the transition operation starts, and −9V when the transition operation ends.

In this state, the first N-type and the second P-type transistors are in ON state, and the first P-type and the second N-type transistors are in OFF state.

Therefore through current does not exist in the circuit of the voltage transistor 300.

Effect

As described above, the voltage translator 300 of this embodiment can turn the first N-type transistor N1 ON and OFF depending on the decoder signal. Therefore not only the first operating voltage VX but the second operating voltage VXGND as well can be supplied to a selected wordline WL.

Also by disposing the second N-type transistor N2 having a feedback function, the transition speed from the voltage of the wordline WL to the second operating voltage VXGND increases.

Also both the fifth P-type transistor P5 and the fifth N-type transistor N5 are in ON state, and control the gate electrodes of both the first P-type transistor P1 and the first N-type transistor N1 in the initial stage of the transition. Therefore switching faster than the conventional voltage translator 400 is possible.

Since the voltage translator 300 can be comprised of a small number (6) of transistors, the voltage translator 300 can be compact.

In the above description, the first main electrode is the source electrode and the second main electrode is the drain electrode, but the source electrode and the drain electrode can be switched if possible, since an MOS transistor normally has a symmetrical structure.

What is claimed is:

1. A voltage translator which is connected to a first operating voltage source and a second operating voltage source, and supplies a positive first operating voltage from said first operating voltage source or supplies a second operating voltage lower than an earth potential from said second operating voltage source to a wordline depending on an output signal of a decoder, comprising:

a first PMOS transistor which has a first main electrode connected to said first operating voltage source and a second main electrode connected to said wordline;

a first NMOS transistor which has a first main electrode connected to said second operating voltage source and a second main electrode connected to said wordline;

a second PMOS transistor which has a first main electrode connected to said first operating voltage source, a second main electrode connected to a control electrode of said first PMOS transistor, and a control electrode connected to said wordline;

a second NMOS transistor which has a first main electrode connected to said second operating voltage source, a second main electrode connected to a control electrode of said first NMOS transistor, and a control electrode connected to said wordline;

a third NMOS transistor which has a first main electrode coupled to the earth potential, a second main electrode connected to the control electrode of said first PMOS transistor, and a control electrode which receives the output signal of said decoder;

a third PMOS transistor which has a first main electrode connected to a logical control voltage source, a second main electrode connected to the control electrode of said first NMOS transistor, and a control electrode which receives the output signal of said decoder;

an inverter which has an input terminal which receives the output signal of said decoder;

a fourth NMOS transistor which has a first main electrode connected to the control electrode of said first PMOS transistor, a second main electrode connected to an output terminal of said inverter, and a control electrode connected to said wordline; and a fourth PMOS transistor which has a first main electrode connected to the control electrode of said first NMOS transistor, a second main electrode connected to the output terminal of said inverter, and a control electrode connected to said wordline.

2. The voltage translator according to claim 1, wherein said decoder comprises a NOR circuit which performs a NOR logic operation on first and second input signals and provides the output signal of said decoder as a result of the NOR logic operation.

3. The voltage translator according to claim 1, wherein said decoder comprises a NAND circuit which performs a NAND logic operation on first and second input signals and provides the output signal of said decoder as a result of the NAND logic operation.

4. A level shift circuit comprising:

a first node supplied with a first voltage level;

a second node supplied with a second voltage level, the second voltage level being lower than a ground voltage level;

a third node supplied with a third voltage level, the third voltage level being lower than the first voltage level and being higher than the ground voltage level;

a ground node supplied with the ground voltage level;

an output node;

an input node;

a first PMOS transistor which has a control electrode, a first electrode connected to the first node and a second electrode connected to the output node;

a first NMOS transistor which has a control electrode, a first electrode connected to the second node and a second electrode connected to the output node;

a second PMOS transistor which has a control electrode connected to the output node, a first electrode connected to the first node and a second electrode connected to the control electrode of the first PMOS transistor;

a second NMOS transistor which has a control electrode connected to the output node, a first electrode connected to the second node and a second electrode connected to the control electrode of the first NMOS transistor;

a third NMOS transistor which has a control electrode connected to the input node, a first electrode connected to the ground node and a second electrode connected to the control electrode of the first PMOS transistor;

a third PMOS transistor which has a control electrode connected to the input node, a first electrode connected to the third node and a second electrode connected to the control electrode of the first NMOS transistor;

a decode circuit which receives input signals and which supplies a decoded result of the input signals to the input node;

an inverter which has an input terminal connected to the input node, and has an output terminal;

a fourth NMOS transistor which has a control electrode connected to the output node, a first electrode connected to the control electrode of the first PMOS transistor and a second electrode connected to the output terminal of the inverter; and a fourth PMOS transistor which has a control electrode connected to the output node, a first electrode connected to the control electrode of the first NMOS transistor and a second electrode connected to the output terminal of the inverter.

5. The voltage translator according to claim 4, wherein said decoder comprises a NOR circuit which performs a NOR logic operation on the input signals and provides a result of the NOR logic operation as the decoded result.

6. The voltage translator according to claim 4, wherein said decoder comprises a NAND circuit which performs a NAND logic operation on the input signals and provides a result of the NAND logic operation as the decoded result.

7. A voltage translator comprising:

a first MOS transistor of a first conductive type having a first electrode coupled to a first operating voltage source, a second electrode coupled to a word line, and a control electrode;

a second MOS transistor of the first conductive type having a first electrode coupled to the first operating voltage source, a second electrode coupled to an earth potential and to the control electrode of said first MOS transistor, and a control electrode coupled to the word line;

a third MOS transistor of a second conductive type opposite the first conductive type, having a first electrode coupled to a second operating voltage source, a second electrode coupled to the word line, and a control electrode;

a fourth MOS transistor of the second conductive type having a first electrode coupled to the second operating voltage source, a second electrode coupled to a logical control voltage source and to the control electrode of said third MOS transistor, and a control electrode coupled to the word line; and a control circuit, coupled to an input terminal of the voltage translator, the control electrode of said first MOS transistor and the control electrode of said third MOS transistor, that accelerates switching of said first and third MOS transistors responsive to a voltage of the word line, wherein said control circuit comprises an inverter having an input coupled to the input terminal of the voltage translator, a fifth MOS transistor of the first conductive type having a first electrode coupled to an output of the inverter, a second electrode coupled to the control electrode of said third MOS transistor, and a control electrode coupled to the word line, and a sixth MOS transistor of the second conductive type having a first electrode coupled to the output of the inverter, a second electrode coupled to the control electrode of said first MOS transistor, and a control electrode coupled to the word line.

8. The voltage translator of claim 7, further comprising:

a seventh MOS transistor of the first conductive type, coupled between said fourth MOS transistor and the logical control voltage source, that is switchable responsive to a signal at the input terminal of the voltage translator; and an eighth MOS transistor of the second conductive type, coupled between said second MOS transistor and the earth potential, that is switchable responsive to the signal at the input terminal of the voltage translator.

9. The voltage translator of claim 8, wherein said first, second, fifth and seventh MOS transistors of the first conductive type are PMOS transistors, and wherein said third, fourth, sixth and eighth MOS transistors of the second conductive type are NMOS transistors.

10. The voltage translator of claim 7, wherein said first, second and fifth MOS transistors of the first conductive type are PMOS transistors, and said third, fourth and sixth MOS transistors of the second conductive type are NMOS transistors.

11. The voltage translator of claim 7, wherein the first operating voltage source supplies a first operating voltage greater than the earth potential and the second operating voltage source supplies a second operating voltage less than the earth potential.

12. The voltage translator of claim 7, wherein a decoder is coupled to the input terminal of the voltage translator, said decoder providing a decoded signal to the input terminal of the voltage translator responsive to coded input signals.

13. The voltage translator of claim 12, wherein said decoder comprises a NOR circuit which performs a NOR logic operation on the coded input signals and provides a result of the NOR logic operation as the decoded signal to the input terminal of the voltage translator.

* * * * *